United States Patent [19]

Trumper

[11] Patent Number: 5,196,745
[45] Date of Patent: Mar. 23, 1993

[54] MAGNETIC POSITIONING DEVICE
[75] Inventor: David L. Trumper, Concord, N.C.
[73] Assignee: Massachusetts Institute of Technology, Cambridge, Mass.
[21] Appl. No.: 746,342
[22] Filed: Aug. 16, 1991
[51] Int. Cl.[5] .......................................... H02K 41/00
[52] U.S. Cl. .................................. 310/12; 310/90.5; 318/135
[58] Field of Search ................... 310/12, 13, 14, 90.5; 318/135, 640, 563, 687

[56] References Cited

U.S. PATENT DOCUMENTS

| | | | |
|---|---|---|---|
| 3,376,578 | 4/1968 | Sawyer | 310/13 |
| 3,771,033 | 11/1973 | Matsui | 318/135 |
| 3,829,746 | 8/1974 | Van et al. | 368/135 |
| 3,937,148 | 2/1976 | Simpson | 104/148 MS |
| 4,055,123 | 10/1977 | Heidelberg | 104/148 LM |
| 4,300,807 | 12/1981 | Poubeau | 310/83 |
| 4,369,388 | 1/1983 | Ban et al. | 310/154 |
| 4,509,002 | 4/1985 | Hollis, Jr. | 318/687 |
| 4,628,238 | 12/1986 | Smulders et al. | 318/687 |
| 4,644,205 | 2/1987 | Sudo et al. | 310/90.5 |
| 4,654,571 | 3/1987 | Hinds | 318/687 |
| 4,689,529 | 8/1987 | Higuichi | 318/135 |
| 4,698,575 | 10/1987 | Bouwer | 319/640 |
| 4,700,100 | 10/1987 | Congdon et al. | 310/332 |
| 4,754,185 | 6/1988 | Gabriel et al. | 310/309 |
| 4,766,358 | 8/1988 | Higuchi | 318/135 |
| 4,788,477 | 11/1988 | Teramachi | 318/135 |
| 4,807,729 | 5/1978 | Yamazaki et al. | 318/601 |
| 4,874,998 | 10/1989 | Hollis, Jr. | 310/90.5 |
| 4,885,490 | 12/1989 | Takahara | 310/90.5 |
| 4,900,962 | 2/1990 | Hockney et al. | 310/90.5 |
| 4,965,864 | 10/1990 | Roth et al. | 318/135 |
| 5,038,062 | 8/1991 | Shikari | 310/39 |
| 5,079,493 | 1/1992 | Futami et al. | 318/640 |
| 6,341,191 | 1/1987 | Studer | 310/90.5 |

FOREIGN PATENT DOCUMENTS

| | | |
|---|---|---|
| 0231109 | 8/1987 | European Pat. Off. |
| 0017809 | 1/1982 | Japan |
| 0119813 | 6/1986 | Japan |
| 0202833 | 8/1989 | Japan |

OTHER PUBLICATIONS

M. Morishita, "A New Maglev System for Magnetically Levitated Carrier System" May 14 to 16, 1986, pp. 199–204.
F. Matsumuar, "Completely Contactless Linear DC Motor Using Magnetic Suspension" 1987, pp. 95–103.
Slocum, "Design Considerations for Ultra-Precision Magnetic Bearing Supported Slides", Feb. 2–4, 1988, pp. 1–29.

Primary Examiner—Steven L. Stephan
Assistant Examiner—Judson H. Jones
Attorney, Agent, or Firm—Wolf, Greenfield & Sacks

[57] ABSTRACT

A device for controlling the relative position between a movable platen and a stator, with linear motions, for example in the 200 to 300 mm range, being provided in one or two of the degrees of freedom and precision control in the 10 nm range being provided in six degrees of freedom. Linear motion is provided by adjacent pairs of magnetic arrays and coil arrays, with the magnetic array of each pair preferably being mounted to the platen and the coil array to the stator. Both arrays have smooth mating surfaces spaced by a predetermined gap. Adjacent magnets of each magnetic array are oppositely poled and each coil array has multiple phases, the pitches of the two adjacent arrays preferably being substantially equal. The weight of the platen may be supported by the magnetic and coil arrays or separate magnets may be provided for this purpose.

42 Claims, 5 Drawing Sheets

MAGNETIC POSITIONING DEVICE

This invention was made with government support under contract No. F19628-90-C-0002 awarded by the Air Force. The government has certain rights in the invention.

FIELD OF THE INVENTION

This invention relates to precision positioning devices, and more particularly to a device which provides for extended movement in one or two degrees of freedom while maintaining precision control in multiple degrees of freedom.

BACKGROUND OF THE INVENTION

There are many applications where an object must be positioned in multiple degrees of freedom, for example six degrees of freedom, with high precision in the nanometer range, while also being movable, generally in one or two such degrees of freedom, over a greater range, for example 200 to 300 millimeters with, for example, 10 nm accuracy Such applications might include scanned probe microscopy; however, the primary application would be in precision, mechanically suspended linear slides in XY stages, such as those used in the motion control subsystem of a photolithographic machine for producing semiconductor integrated circuits.

Current wafer stepping machines use compound axes in coarse/fine stages to achieve travels of about 200 mm in X and Y with resolution better than 100 nm. The camera head may be moved on flexures to provide Z-axis focusing motion. Such devices are relatively large and heavy and achieve positioning in six degrees of freedom through use of numerous actuators, including rack and pinion or ball screws for the coarse motion and piezoelectric or miniature hydraulic actuators for the fine motion. Thus, the overall system is complex and is also very expensive. It is also difficult to design each stage to be free of resonances, and thus to provide fast settling times as the stage moves from one chip site to another.

In order to reduce complexity both in the system itself and in the design thereof, magnetically-suspended XY stages have been proposed for such applications. Copending application Ser. No. 632,965, filed Dec. 20, 1990, teaches a magnetic bearing which may be utilized for maintaining the position of an object with a high degree of precision and for making small position adjustments which would typically not exceed 250 microns in any direction. Such a stage could therefore be used only for very fine positioning, and one or more additional coarse positioning stages would be required to achieve the degree of movement required for XY positioning applications such as in photolithographic machines for semiconductor fabrication.

A need therefore exists for an improved positioning device which would provide positioning control in the 10 nm range, preferably in six degrees of freedom, while permitting movement with good acceleration and settling time over a range of several hundred mm, for example 200 to 300 mm, preferably in both the X and Y direction. Such magnetic positioning device might also provide the capability for controlled movement in the Z direction (i.e. in a direction perpendicular to a work surface), also with precision in the 10 nm range.

While many magnetic linear positioning devices are described in the literature, most of these devices provide for motion in only a single direction. Further, such devices employ toothed magnetic elements and/or toothed or slotted electromagnetic actuators. This results in a cogging when no actuating current is applied to the device, or, in other words, in detenting occurring at certain preferred positions. This means that the only way a precision position can be maintained which is not one of the detent positions is to maintain current in the coils, which current must be sufficient to overcome the detent effect This cogging effect thus makes it far more difficult to achieve precise positioning with fine resolution, makes it harder to maintain stability of the device at a precisely determined position, and increases the time required to stabilize the device at a desired position. Teeth on the magnets and/or on the coils are therefore undesirable.

Further, where coils are in slots or on an iron core, as is the case for most prior art linear actuators, the device has a narrower frequency response, and also has a nonlinear hysteresis curve which makes the device harder to control and results in some energy losses. Such hysteresis losses, in conjunction with eddy currents which also exist in such cores, reduce the high frequency response and power efficiency of the device. All of this results in poor stiffness for the device, or in other words, in decreased stability.

Existing devices also normally operate in a stepping mode. However, there are applications, for example in semiconductor fabrication, where a scanning mode of operation is desirable wherein movement from a first point to a second point is accomplished at a precisely controlled speed. This permits exposure to be performed along a strip which allows a simpler optical design in the exposing lens.

A need therefore exists for an improved positioning device which is preferably capable of positioning an object in the X and Y degrees of freedom with travel in the 200 to 300 mm range with 10 nm resolution, and with good acceleration and stabilization times. The device should also be capable of maintaining a desired position for the object in six degrees of freedom with the same level of resolution, should be of lower cost than existing systems and should permit operation in either a stepping mode or a scanning mode.

SUMMARY OF THE INVENTION

In accordance with the above, this invention provides a device for positioning a movable member relative to a stationary member, which members have at least one pair of adjacent surfaces. A magnetic array is mounted in one of the adjacent surfaces, the array having a plurality of adjacent magnetic elements aligned in the direction of movement, which elements are oppositely poled. The magnetic elements are preferably permanent magnets, with adjacent magnets being oppositely poled and the array of permanent magnets is preferably mounted in the adjacent surface of the moving member. A multiphase coil array is also provided which is mounted in the other adjacent surface in a position to electromagnetically interact with the magnetic array The magnetic array and the coil array are preferably mounted so as to provide smooth, mating adjacent surfaces spaced from each other by a substantially uniform gap. Controlled currents are selectively applied to each phase of the coil array in a phase, amplitude and polarity to interact with the magnetic array to drive the moveable member to a selected position relative to the stationary member.

Each of the arrays has a pitch, which pitches are a substantially integral multiple of each other and are preferably substantially equal. The forces generated when currents are applied to the coil array have a component parallel to the arrays and a component perpendicular to the arrays. The parallel component is preferably operable to move the moveable member to the selected position while the perpendicular component may be utilized to support the weight of a moveable member and thereby to maintain the gap between the members. Where the weight of the moveable member may be varied, a means may also be provided for varying the perpendicular force applied to the moving member to maintain a desired gap between the adjacent surfaces of the members. The means for varying the perpendicular force may include varying the spacing between a ferrous backing sheet for the coils and the coil array.

A desired gap between the adjacent surfaces may be maintained in a number of ways including providing first and second magnetic elements mounted respectively to the moving member and the stationary member, which elements are adjacent mounted and poled to counteract the effects of gravity on the moving member. The first magnetic element is preferably mounted to the bottom surface of the moving member, and the second magnetic element is preferably mounted to the adjacent surface of the stationary member with the magnetic elements being poled to repel. Where the moving member has a weight which may be varied, at least one of the magnetic elements may be moveable in a direction perpendicular to the gap to permit a desired gap to be maintained regardless of variations in the weight of the moving member.

The coil array preferably has at least three phases. The relative movement between the members is in at least a first degree of freedom parallel to the adjacent surfaces, with the relative position of the members also being controlled in other selected degrees of freedom. The control in other selected degrees of freedom may be accomplished by indicating a desired relative position for each of the degrees of freedom, detecting deviations from desired position for the degrees of freedom, and applying an electromagnetic force to the moving member in response to a detected deviation in a direction to move the moving member to the desired relative position. For some embodiments, electromagnetic force is applied to the moving member by electromagnetic elements mounted to the stationary member, with a ferrous element being mounted to the moving member adjacent each electromagnetic element. Each electromagnetic element/ferrous element pair is positioned to move the moving member in at least one degree of freedom when the electromagnetic element is energized, the electromagnetic elements being energized in response to a detected deviation.

For preferred embodiments, there are at least two magnet array/coil array pairs for controlling motion in a first degree of freedom. For one embodiment, there is a magnetic array/coil array pair on one side of the moving member for each such pair on the opposite side. The adjacent surface for the moving member is preferably its bottom surface, and there are preferably two symmetrically positioned magnetic arrays on such bottom surface for each degree of freedom in which the array is to be driven, with an adjacent corresponding coil array on the stationary member for each of the magnetic arrays. Other possible configurations include having like numbers of magnetic arrays on the top and bottom surfaces of the moving member, and having magnetic arrays on opposite sides of the moving member along with a magnetic array on the bottom of the member. For all embodiments there are one or more corresponding adjacent coil array on the stationary member for each of the magnetic arrays.

For preferred embodiments, there are magnetic array/coil array pairs for relative movement between the members in both a first degree of freedom and a second degree of freedom. For the preferred embodiment, there are two symmetrically positioned magnetic arrays oriented parallel to the first degree of freedom, and two symmetrically positioned magnetic arrays oriented parallel to the second degree of freedom in at least one of the top or bottom surfaces of the moving member, with an adjacent corresponding coil array for each magnetic array. For such embodiments, one of the arrays of each magnetic array/coil array pair for controlling motion in each of the two degrees of freedom is sufficiently wider in the direction of the other degree of freedom than the other array so that the arrays fully couple regardless of any movement in the other degree of freedom. For the most preferred embodiment, the magnetic arrays are in the bottom surface of the moving member.

To control the relative position of the members, the relative position of the members in at least a first degree of freedom is detected and an indication of a selected relative position is provided. In response to the detected relative position and the selected relative position, control currents are produced to move the movable member in the first degree of freedom toward the selected relative position. The circuitry by which the control currents are produced may include a linear feedback compensator, a non-linear geometric compensator to compensate for changes in relative position of the center-of-mass of the moving member as it is moved relative to the stationary member, and a computation circuit to compensate for non-linearities in the applied forces as a function of the control currents. Where control is being provided in two degrees of freedom, position detection and desired position indications would be for both degrees of freedom, and control current would be applied to appropriate coil arrays to move the movable member in the two degrees of freedom to the selected relative position. Position detecting may be accomplished using interferometric detectors for detecting relative movement and capacitive detectors for detecting relative positions.

For preferred embodiments, the movable member is formed of a cellular, composite material. The gap between adjacent surfaces may contain air or may contain a damping fluid such as oil or ferrofluid. The device of the invention may be utilized as a fine positioning stage of a positioning system, with the stationary member being mounted to a movable frame of a system coarse positioning stage and/or the device may be used as a positioning device for a photolithography system such as those used in semiconductor fabrication.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1:
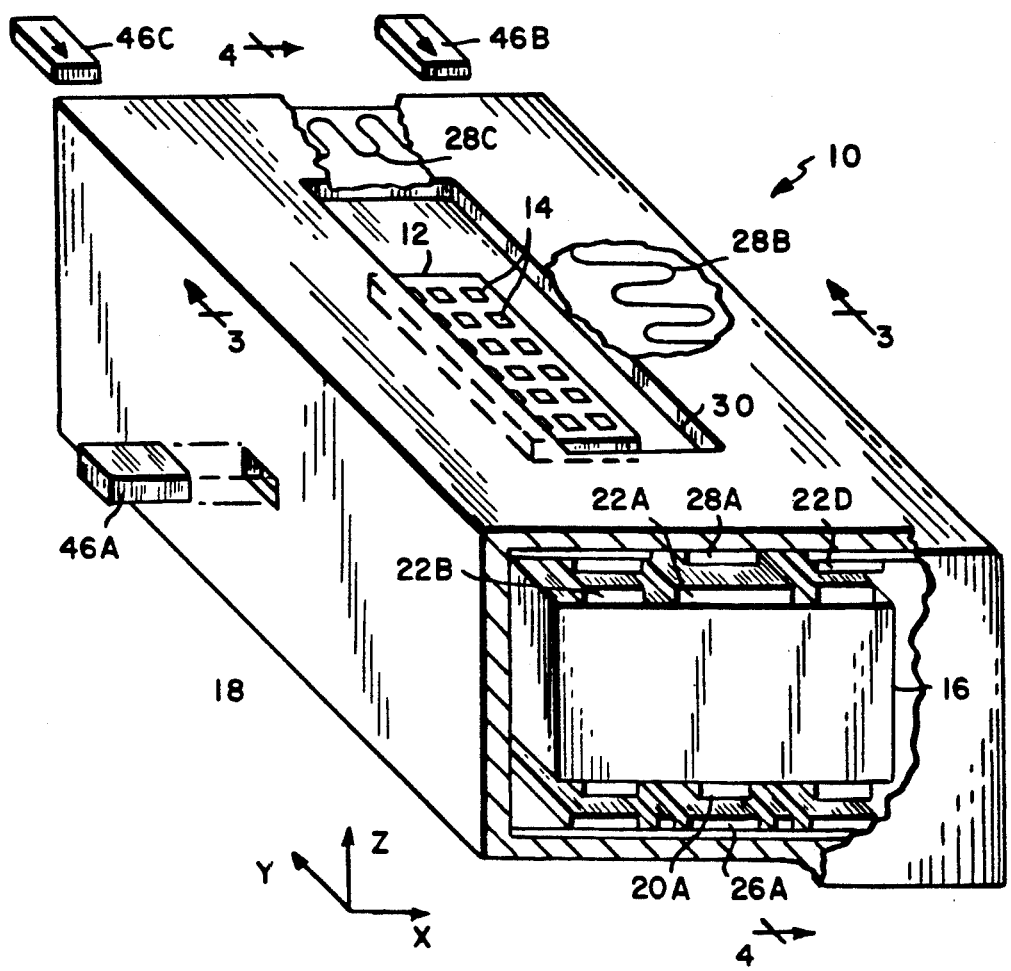
FIG. 1 is a partially cut-away front top perspective view of a positioning device incorporating the teachings of this invention.
Figure 3:
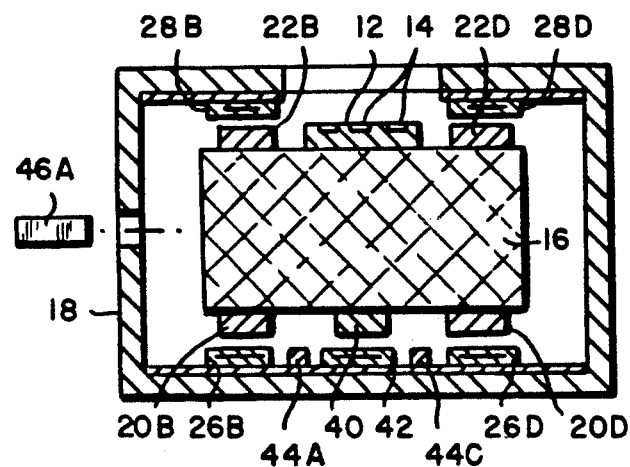
FIG. 3 is a sectional view taken along the line 3—3 in FIG. 1.
Figure 4:
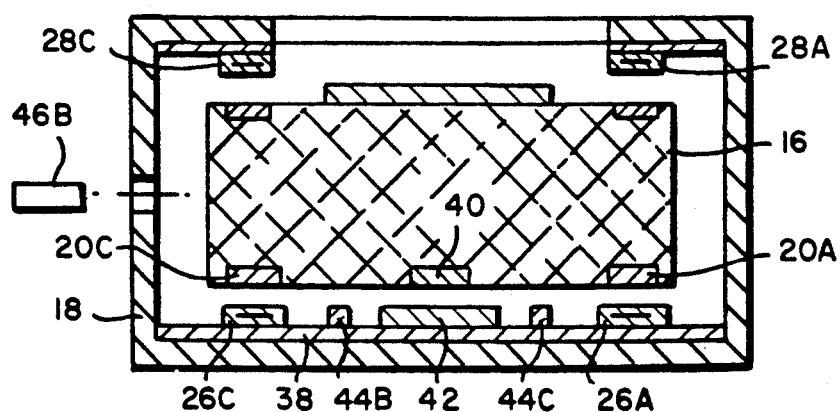
FIG. 4 is a sectional view taken along the line 4—4 in FIG. for a slightly modified embodiment of the invention.

FIG. 1 shows a positioning device 10 which is utilized to control the position of a semiconductor substrate 12 having a plurality of semiconductor devices 14 formed thereon. The substrate 12 is mounted on a movable platen 16, which platen is magnetically suspended in a stator housing or frame 18. Stator 18 may be mounted to a table or other stationary object or may be mounted to a movable element of a coarse positioning stage. Platen 16 may be formed of a solid block of a non magnetic material, but, as may be best seen in FIGS. 3 and 4, is preferably in the form of a hollowed out cellular structure, preferably fabricated of a composite material, such as graphite composite. Such structure reduces weight while maintaining strength and stiffness. Stator 18 may be a solid or semisolid housing or may be an open frame. It may be formed of the same cellular structure indicated for the platen, for basically the same reasons.

For the preferred embodiment, the platen 16, and the substrate 12 mounted thereto, are positionable over distances sufficient to permit all areas on substrate 12 to be positioned under a photolithoqraphic head in both the X and Y dimension. For current semiconductor substrates, this would be a distance of approximately 200 to 300 mm; however, this distance is not a limitation on the invention, and the teaching of this invention may be utilized for movements over qreater or lesser distances. The device 10 also permits small movements to be made in the Z direction. Once a desired position for the substrate 12, and thus for platen 16, is established, the device is capable of maintaining such position with a high level of precision, in the 10 nanometer range, in the X, Y, and Z directions. The device also maintains a precise position in the three degrees of rotation which occur about these three axes.

Figure 2:
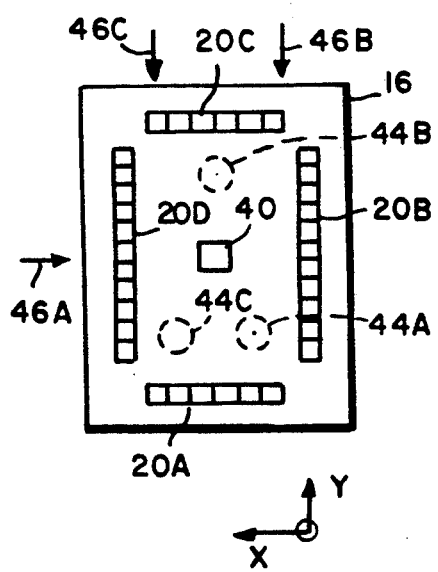
FIG. 2 is a bottom view of the platen for the embodiment of the invention shown in FIG. 1.

Referring to FIGS. 1-4, the mechanisms for effecting these controls include four magnet arrays 20A-20D (best seen in FIG. 2) mounted to the bottom of platen 16 and four corresponding magnet arrays 22A-22D mounted to the top of the platen. The magnet arrays may be mounted to the surface of the platen as shown in FIGS. 1-3 or may be embedded in the platen as shown in FIG. 4.

Figure 5:
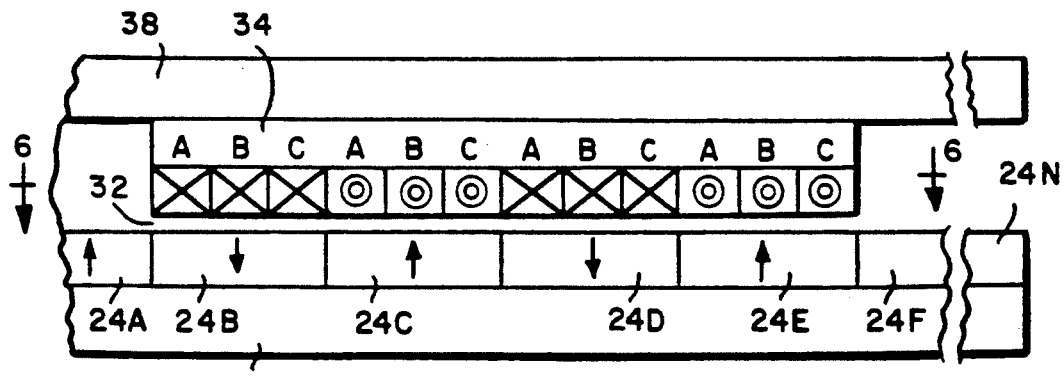
FIG. 5 is an enlarged cut-away view of a single actuator of a type utilized with preferred embodiments of the invention.

As may be best seen in FIG. 5, each magnet array 20,22 consists of a plurality of adjacent magnets 24A-24N, with each pair of adjacent magnets being of opposite polarity. Thus, in FIG. 5, the magnets 24A, 24C and 24E are poled with their north poles away from the platen while magnets 24B, 24D and 24F are poled with their north poles toward the platen. The magnetic arrays 20B, 20D, 22B and 22D extend in the Y direction while the magnetic arrays 20A, 20C, 22A and 22C extend in the X direction.

For each magnetic array 20A-20D, there is a corresponding coil array 26A-26D mounted to stator 18. Similarly, for each magnetic array 22A-22D, there is a corresponding coil array 8A-28D mounted to upper walls of stator 18. Stator 18 has a cutout 30 formed in its top wall or surface through which substrate 12 is exposed, with coil arrays 28 being mounted in the inside of the upper wall of the housing around the periphery of opening 30.

Figure 6:
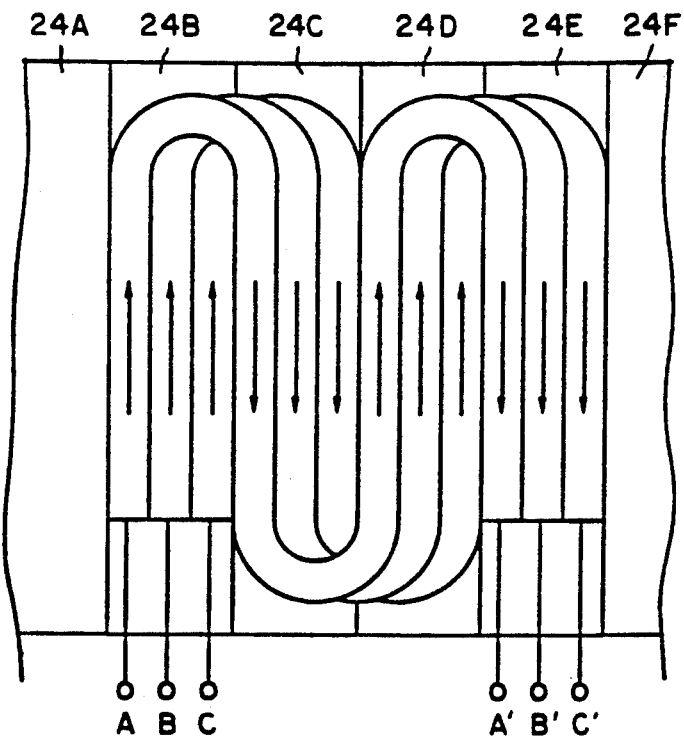
FIG. 6 is a top view of an actuator of the type shown in FIG. 5.

Each coil array 26,28 is formed of a plurality of coil windings. While each coil array could have as few as two phases, it is preferable that the coil array have three or more phases. FIG. 6 illustrates several turns of a three phase coil array suitable for use in practicing the teachings of the invention. From FIGS. 5 and 6, it can be seen that the pitch of the coil arrays, defined as the spacial periodicity length of the winding pattern (i.e. the distance between periodic points on a given winding), is substantially equal to the pitch of the magnets measured from a point on one magnet 24 having a given polarity to the corresponding point on the next magnet in the array having the same polarity. While this equality is true for the preferred embodiment of the invention, it is not a limitation on the invention, the only requirement being that the pitches of the two arrays be approximately an integral multiple of each other. An example of a suitable pitch for the arrays for a semiconductor application is 5 cm. Further, while three phases are shown for the array for the preferred embodiment, additional phases will provide enhanced resolution and are preferred in applications where very close positional accuracy is required. The spacing between adjacent wires for the phases is equal to the pitch P of the coil divided by two times the number of phases N.

As may be best seen in FIG. 5, magnets 24 and coil windings A, B, C are spaced by a gap 32. The magnets and coils on either side of gap 32 form a smooth surface. In other words, there are no teeth formed on magnets 24 and coils A, B, C are not wound on a core nor do they have any teeth. Preferably, the wires of each coil array are formed into the desired shape and pitch and are then either encapsulated in an epoxy or other suitable non conducting material or are mounted to a backing plate 34 of a non-conducting material and secured thereto by suitable means. The thickness of the coils may be adjusted to optimize power efficiency.

In FIG. 5 and the other figures, the length or extent of each magnetic array in the movement direction for the array is shown as being greater than the length of the corresponding coil array by an amount which is greater than the extent over which the platen is to be moved in such direction by the array. Thus, if the array were being used to move platen 16 in the Y direction and the platen was to move a maximum of 200 mm in the Y direction, the magnetic array 20B would be longer than the coil array 22B by somewhat more than 200 mm. This permits the magnetic array to be over the entire coil array through the entire extent of travel of the platen so that coupling forces are substantially equal regardless of platen position. However, while for the preferred embodiment where the extent of travel of the platen is less than the size of the platen, this arrangement is feasible, it is apparent that where the extent of the travel is greater than the size of the platen, the array mounted to the stator, which for the preferred embodiment is the coil array, would need to be longer than the magnetic array to permit full coupling between the two arrays throughout the entire range of travel. Particularly in such applications, to reduce required coil currents, a single long coil array could be replaced with a plurality of shorter coil arrays spaced by a distance less than the length of the corresponding magnet array. Further, while for the preferred embodiment it is the coil array which is on the stator, and this is preferred since it is easier to make electrical connections to the stator than to the platen, the invention could also be implemented with coils on platen 16 and permanent magnets on stator 18.

As may also be seen in the figures, either the coil array or the magnetic array must be wider than the other by an amount sufficient so that there will be full coupling between the arrays for movement in one direction, regardless of movement in the other direction. Thus, for example, as may be best seen in FIG. 3, coils 28 are wider than the corresponding magnets 26 by an amount sufficient so that there will always be full coupling between these two arrays, regardless of any movement in the X direction as a result of energization of coils 26A, 28A, 26C and/or 28C or any movement in the Y direction as a result of energization of coils 26B, 26D, 28B and/or 28D. Either the coil array or the magnetic array may be the wider array, the wider magnetic array being normally preferred since it provides greater power efficiency at the expense of increasing the size of the platen. Wider coil arrays may also be slightly less expensive in some configurations.

In FIG. 5, an iron bar 36 is shown behind magnets 24. While bar 36 is not essential in practicing the teachings of this invention, it enhances the magnetic flux of the magnets, providing substantially the same flux as would be obtained with a magnet of twice the thickness. Since high quality magnets, such as rare earth magnets of the type which might be utilized for a positioning device of this invention, are relatively expensive, iron bar 36 permits the desired flux to be obtained at lower cost.

FIG. 5 also shows an iron bar 38 positioned behind the coil array. With back iron 38 being employed for the coils 28A 28D, the attraction of permanent magnet arrays 22 for this back iron may be utilized to support the weight of platen 16, including any load such as substrate 12 positioned thereon. The position of back iron 38 may be moved relative to the coil array and gap 32 to permit a desired static position in the Z direction to be obtained for platen 16 and to compensate for changes in the weight of platen 16 which may occur, for example, when a load such as substrate 12 is added to the platen or removed therefrom. Iron bar 38 also enhances the magnetic forces from the coil by up to a factor of two, depending on its position relative to the gap and coil.

However, back iron 32 may also have significant negative effects on the performance of the device. To allow hood high frequency response, this iron backing must be laminated. However, the iron's non-linear magnetization and hysteresis characteristics will render the motor forces non-linear with stator coil current. This poses significant problems in decoupling platen motion in the various degrees of freedom. More specifically, a transient such as a step in position in one degree of freedom will inevitably couple into the other degrees of freedom through the non-linear magnetization curve of the back iron. While at low frequencies, these non-linearities can be rejected by the control circuitry, it is virtually impossible to compensate for this non-linearity in the presence of high-frequency transients. Therefore, it is preferred to sacrifice the enhanced coil flux resulting from iron backing 38 and the weight support for the platen which the interaction of such back iron with the magnets 24 provides.

Without back iron 38, some other means must be provided for supporting the static weight of the platen. While this may be accomplished by continuously energizing at least selected ones of coils 26A–26D and/or 28A–28D, this is not an energy efficient way of accomplishing the objective. Therefore, this objective is typically accomplished either by providing iron 38 away from an associated coil array 28, but still over portions of the corresponding magnetic array 22; or preferably, as shown in FIGS. 1–4, by providing permanent magnets specifically dedicated to this function. In particular, referring, for example, to FIGS. 2 and 3, a permanent magnet 40 is affixed to the underside of platen 16, for example, near the center thereof, and a permanent magnet 42 is mounted to stationary frame or housing 18 directly under magnet 40. Magnets 40 and 42 are poled to repel, the magnetic force between the magnets 40 and 42 at the gap therebetween being balanced by the weight of the platen at the desired Z position of the platen. The gap between the magnets 40 and 42 may be adjusted in the manner described in co pending application Ser. No. 07/632,965 by adjusting the vertical position of magnet 42 to initially balance the weight of platen 16 at the desired Z position and to compensate for any changes in such weight which may arise, for example, as a result of the loading or unloading thereof. For reasons which are discussed in some detail in the copending application incorporated hereby by reference, the gap for magnets 40,42 is preferably greater than the gap for the magnetic array/coil array pairs. It may be necessary to partially or fully embed the magnets 40,42 to achieve this objective. One of the magnets, for example, magnet 42 must also be sufficiently larger than the other in the X and Y dimensions so that there is full coupling between the magnets through the full X-Y range of motion of the platen.

The position of platen 16 in the Z direction and in rotation about the X and Y axes are detected by three capacitive sensors 44A, 44B, 44C mounted in the bottom of stator 18 and extending into the gap between the platen 16 and stator 18. While these capacitive sensors can be seen in FIGS. 3 and 4, their exact positioning in a triangle under the platen is best illustrated in FIG. 2 with dotted lines illustrating the points on platen 16 overlying each of the capacitive sensors.

Movements of platen 16 in the X and Y direction and in rotation about the Z axis are detected by three interferometric detectors 46A, 46B and 46C, which detectors are shown in FIG. 1, FIG. 3 and FIG. 4. The point where the interferometric detection readings are taken on platen 16 are illustrated by the arrows having the same numbers shown in FIG. 2.

While in the figures the gaps between platen 16 and stator 18 are shown filled with air, in some applications it may be desirable to fill one or more such gaps with a damping fluid such as oil or ferrofluid. This is done because air has relatively poor damping characteristics, and damping of platen movement caused by vibration or other perturbations on the platen can thus be enhanced by providing damping fluid in the spaces. However, enhanced damping also results in increased response time for the system and may, therefore, not be desirable in applications where rapid response time is desired. If the fluid employed has sufficient density, platen 16 may be floated on the fluid, eliminating the need for magnets 40 and 42. Height adjustment for the platen may then be provided by controlling the quantity of fluid. Ferrofluid may also be utilized in the manner described in the beforementioned copending application to effect positioning of the platen.

Figure 7:
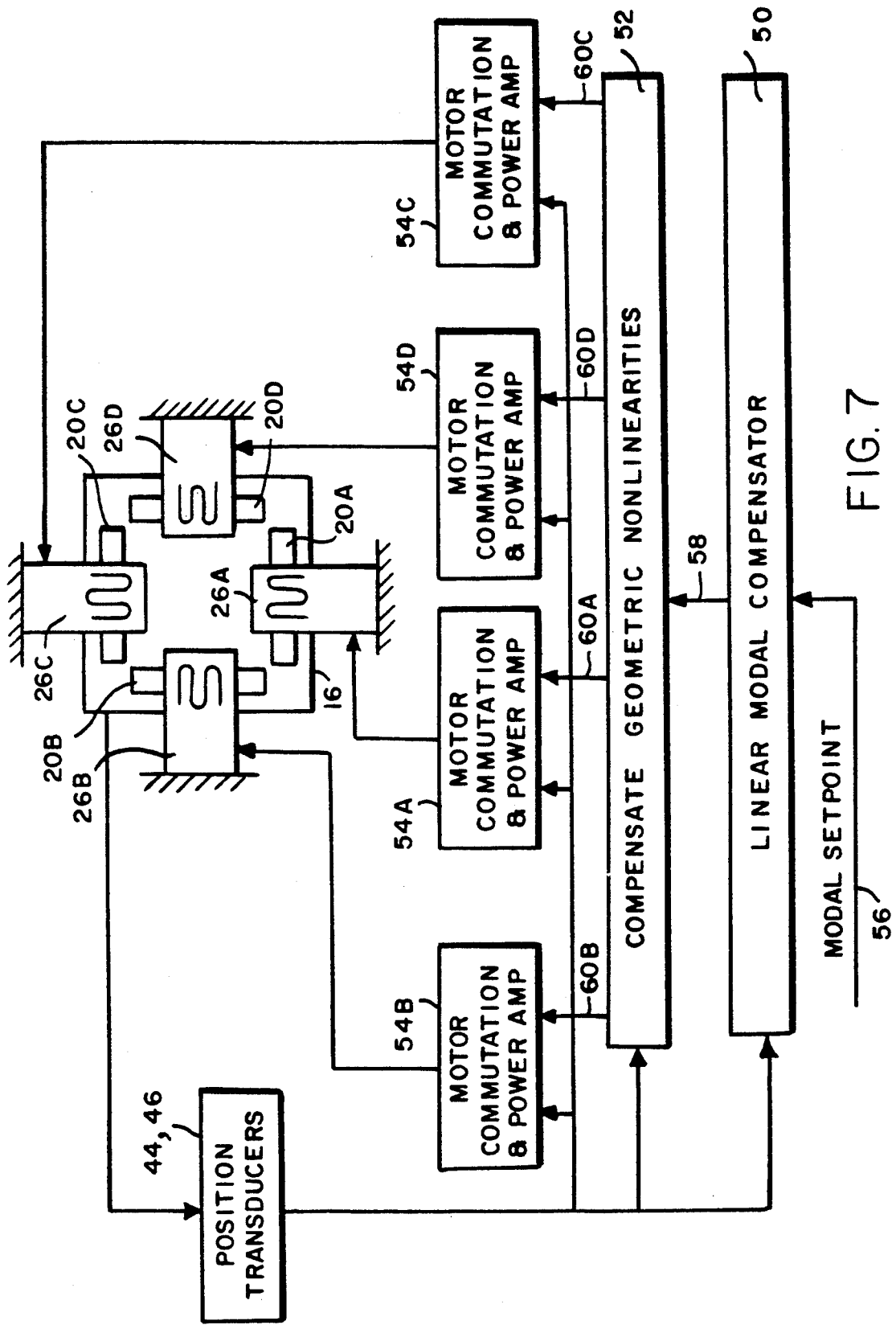
FIG. 7 is a block schematic diagram of a system utilizable in practicing the teachings of this invention

FIG. 7 shows the control system for use with a position controller of the type shown in FIGS. 1-4; however, to simplify the controls, in FIG. 7 it is assumed that magnets and coils are mounted only at the bottom of platen 16 (i.e. magnets 20A-20D and coils 26A-26D); magnet arrays and coil arrays are not utilized on the top of the platen. While this arrangement simplifies the controls for the device and also permits a larger work area on the top of the platen, these advantages are achieved at the price of somewhat reduced control and positional stability. However, for most applications, a configuration such as that shown in FIG. 7 with magnet arrays and coil arrays only on the bottom of the platen is preferred.

In FIG. 7, the outputs from the capacitive position sensors 44 and the interferometric position sensors 46 are connected as inputs to a linear modal compensator circuit 50 and to a compensate geometric non linearities circuit 52. At least selected ones of the transducer outputs are also applied to appropriate ones of motor commutation and power amp circuits 54A-54D. The outputs from each circuit 54 are the phase currents applied to the corresponding coil array 26. Since currents in the coils 26 are used (a) to correct for both spurious linear movement in the X and Y direction and to cause desired linear movements in these directions; (b) to a lesser extent to both correct for and cause linear movements in the Z direction; and (c) to correct for spurious movements in the rotational degrees of freedom, it may be necessary to apply output from all of the sensors 44,46 to all four of the circuits 54.

More particularly, in FIG. 7, only coils 26A and 26C are energized to cause movement of platen 16 in the X direction and only coils 26B and 26D are energized to cause movement of the platen in the Y direction. Movement in the Z direction can be effected by suitably altering the currents in coils otherwise energized to effect movement in the X or Y direction, or either one or both of the opposed pairs of coils may be energized with signals having a phase and amplitude such as to result in a zero net translation force, thereby effecting movement only in the Z direction.

Similarly, a spurious rotation around the X axis may be corrected by applying currents of suitable amplitude and phase to the coils 26A,26C to push and pull on the appropriate sides of the platen without generating any net linear forces. A spurious rotation around the Y axis is corrected by similarly applying currents to coils 26B,26D. A spurious rotation around the Z axis may be similarly corrected by applying opposing currents to two opposite coils, to rotate the platen in the appropriate direction. Alternatively, currents of appropriate polarity may be applied to all four coils to effect a correction for rotation about the Z axis.

Under continuous motion, the signals applied to the coils have a generally sine wave profile, the relative phases of the signals determining the drive direction, and the amplitude and frequency of the currents determining drive acceleration and translation speed. The driving of the platen in a given direction occurs as a result of the Lorenz force cross-product ($F = J \times B$ following the right hand rule. Thus, by suitably controlling the currents in the phase windings in synchronism with the movement of the platen, which movement may be detected by interferometers 46, movement of the platen in a given direction at a given rate may be effected. The magnitude, polarity and phases of the current in the coil winding may be adjusted as a desired position is reached to slow the platen down and to cause the platen to stop at the desired position. This stopping may be accomplished with no overshoot, or some slight overshoot may be permitted which is then corrected in the same manner other positional errors are corrected. With the configuration shown, accelerations of 5 meters/sec$^2$ with a 200 msec settling time can be achieved.

In FIG. 7, modal set points in all six degrees of freedom are inputted into linear modal compensator circuit 50 over lines 56. The signals on lines 56 may be manually inputted or may be obtained from a suitable processor or other control device. This circuit also receives inputs from detectors 44 and 46 indicating the actual position of platen 16 relative to stator 18 in the six degrees of freedom. When the detected position in any degree of freedom is different than the set points inputted on lines 56, this difference is detected in circuit 50, causing an error signal output to be generated on line 58. This error signal output is with reference to the platen, and in particular with reference to the platen's center of gravity. A detected difference may arise either as a result of spurious movement of the platen from a desired set point or as a result of a change in the set point input in, for example, the X and/or Y dimension, indicating that the platen is to be moved to a new position. Compensator 50 may be a standard circuit which compares the modal set point with the actual coordinates from sensors 44,46 to produce error signals. This error signal is then processed through standard linear feedback compensation filters in order to stabilize the system and tailor its dynamics. The one or more of the six possible resulting error signals, one for each of the six degrees of freedom, are then amplified and applied through the lines 58 to compensate geometric non-linearities circuit 52.

Circuit 52 is required because, as platen 16 moves, the point on magnet arrays 20 at which forces are applied by coils 26 also varies. Thus, the points at which forces are applied to the platen varies with respect to the center of mass of the platen based on the relative position between the platen and the stator, resulting in a non-linear relationship between forces generated by the stator coils and these forces and torques as referred to the center of mass of platen 16. The function of circuit 52 is to determine the force in each direction which must be generated by the coils 26 in order to achieve a desired displacement in the various degrees of freedom by solving complex matrix equations with known non linear functions. In particular, the net forces and torques on the platen 16 are given as a non-linear function of the stator forces by the following equation:

$$\begin{bmatrix} F_x \\ F_y \\ F_z \\ T_x \\ T_y \\ T_z \end{bmatrix} = \begin{bmatrix} g_x(x, y, z, \theta_x, \theta_y, \theta_z, \overline{F}) \\ g_y(x, y, z, \theta_x, \theta_y, \theta_z, \overline{F}) \\ g_z(x, y, z, \theta_x, \theta_y, \theta_z, \overline{F}) \\ t_x(x, y, z, \theta_x, \theta_y, \theta_z, \overline{F}) \\ t_y(x, y, z, \theta_x, \theta_y, \theta_z, \overline{F}) \\ t_z(x, y, z, \theta_x, \theta_y, \theta_z, \overline{F}) \end{bmatrix} \overset{\Delta}{=} G(x, y, z, \theta_x, \theta_y, \theta_z, \overline{F}) \quad (1)$$

where $F_x$, $F_y$, $F_z$ $T_x$, $T_y$, $T_z$ are forces and torques, respectively, as represented relative to the platen center of mass;

$g_x$, $g_y$, $g_z$, $t_x$, $t_y$, and $t_z$ are given non linear functions which may be derived from standard kinematic calculations (see, for example, Kane, T.R., and Levinson, D.A., "Dynamics: Theory and Applications", McGraw Hill, 1985).

$x, y, z, \theta_x, \theta_y, \theta_z$ are the relative position in each of the six degrees of freedom of the platen to the stator; and $\overline{F}$ is a vector of the stator forces applied to the platen by coil windings 26. $\overline{F}$ will be assumed to have eight components, two for each winding 26, and may be represented as a function of platen position and coil currents as follows:

$$\overline{F} = f(x, y, z, \theta_x, \theta_y, \theta_z, \overline{i}) \quad (2)$$

where $\overline{i}$ is a vector of coil currents having a component for each phase of coil 26. In particular, the equations for the force components $F_x$ and $F_z$ for a coil, and thus the function f, are calculated by the well-known method of integrating the Lorenz force $F = J \times B$ throughout the volume of the coils, or alternatively by integrating the Maxwell stress tensor over the surface enclosing this volume (see Melcher, J.R. "Continuum Electromechanics", MIT Press, 1981).

Circuit 52 inverts the non-linear function G in order to solve for $\overline{F}$ in terms of $F_x$, $F_y$, $F_z$, $T_x$, $T_y$, $T_z$, which represent the desired platen/stator forces and torques outputted by this circuit 50 dependent upon the positions and rotations $x, y, z, \theta_x, \theta_y, \theta_z$. In particular:

$$\overline{F} = G^{-1}(F_x, F_y, F_z, T_x, T_y, T_z, x, y, z, \theta_x, \theta_y, \theta_z) \quad (3)$$

Again, $\overline{F}$ has eight components, two for each of the coils 26. For example, coils 26A and 26C have components in the X direction and in the Z direction, while coils 26B and 26D have components in the X direction and in the Y direction.

The two components of $\overline{F}$ for each of the coils are outputted on the appropriate lines 60 to the motor commutation and power amp circuit 54 for such coil. The circuit 54 is used to solve for the necessary stator coil currents (i) which the power amplifiers of the circuit are to apply to the stator coils in order to realize the desired forces. $\overline{i}$ is determined in each of these circuits from the relationship:

$$\overline{i} = f^{-1}(x, y, z, \theta hd x, \theta_y, \theta_z, \overline{F}) \quad (4)$$

Circuits capable of performing the functions of circuits 50, 52 and 54 are known in the art. These functions may be performed by special purpose hardware, a separate microprocessor may be provided for performing each of the functions, a single processor may be programmed to perform all of the functions or the functions may be performed by some combination of hardware and software.

Figure 8A:
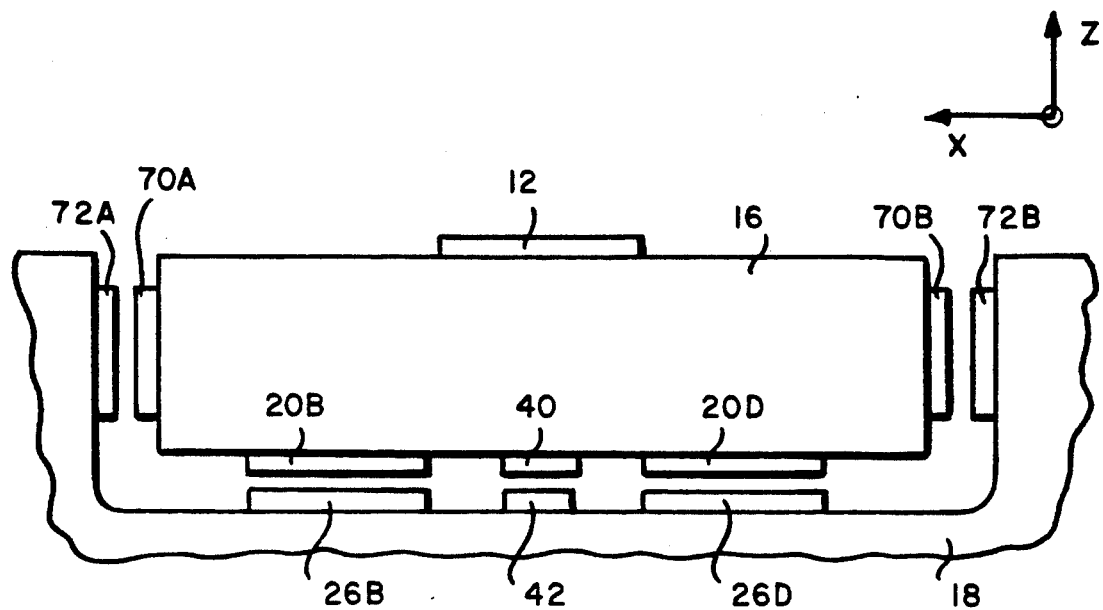
FIGS. 8A and 8B are a front view of a first alternative embodiment of the invention.
Figure 8B:
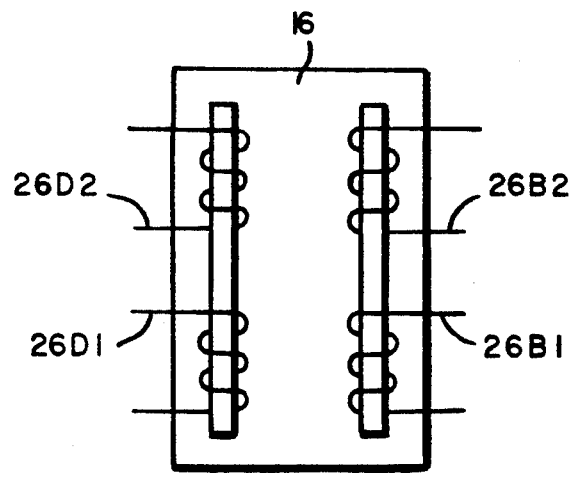

While for the preferred embodiment described above, platen 16 is moved in two dimensions, this is not a limitation on the invention. Thus, it may also be possible in some applications to provide linear drive magnets and coils to also move platen 16 in the Z dimension. A more likely configuration is shown in FIGS. 8A and 8B where long travel linear movement is being performed in only the Y direction, with controls in the other dimensions being provided only to assure that a desired position within a small range of travel is maintained. In FIGS. 8A and 8B, platen 16 has a pair of permanent magnet arrays 20B and 20D affixed to its bottom surface with corresponding pairs of independently energizable coil arrays 26B1, 26B2, 26D1 and 26D2 mounted to stator 18. These arrays function in the manner previously described to effect linear motion of platen 16 in the Y direction with either one coil array or both coil arrays of each pair being energized at a time. Energy usage may be reduced by energizing only coil arrays 26B1 and 26D1 or coil arrays 26B2 and 26D2, depending on platen and magnet array positions. A pair of permanent magnets 40 and 42 poled to repel are also provided which perform the same function as the corresponding magnets for the embodiment of FIGS. 1-4 in supporting the weight of platen 16. Since magnet arrays and coil arrays are not utilized on the top of platen 16, the housing of stator 18 need not extend over the top of the platen as for the embodiments shown in the earlier figures, thus exposing the entire top of the platen to be used for supporting a sample 12.

In addition to the elements utilized in the earlier embodiments, the embodiment of FIG. 8 also has permanent magnet arrays 70A and 70B on opposite sides of platen 16, which arrays extend in the Y direction and a pair of coil arrays 72A,72B, a coil 72 being mounted to stator 18 opposite each magnetic array 70. As for earlier embodiments, the coil arrays 70 would typically be shorter than the magnet arrays so that the magnet array would fully cover the coil array regardless of the linear position of platen 16 relative to stator 18 in the Y degree of freedom. For additional controllability, and/or to provide for travel in excess of one half the platen length, stator coil arrays 72A,72B may also be subdivided into multiple coils in the same manner as for coil arrays 26.

Travel in the Y degree of freedom is accomplished in substantially the manner previously described in conjunction with FIG. 7 by energizing coil arrays 26 and preferably also coil arrays 72 to interact with magnet arrays 20 and 70, respectively. Control to maintain a desired X degree of freedom position against perturbations may be achieved by suitably energizing an appropriate one of the coil arrays 72A,72B. Perturbations in the Z direction may be compensated by suitably energizing coil arrays 26 to either attract or repel, as required. A rotation around the Y axis may be compensated for by energizing a suitable set of the coils 26 while a rotation about the Z axis may be compensated by energizing coils 26B and 26D to drive their corresponding magnetic arrays in opposite directions, by energizing coils 72A and 72B to drive their corresponding magnetic arrays in opposite directions, or by suitably energizing both sets of coils. An undesired rotation about the X axis may be compensated for by independently energizing either coil arrays 26B1, 26D1 or 26B2, 26D2 to produce a net corrective torque about the X axis.

Figure 9:
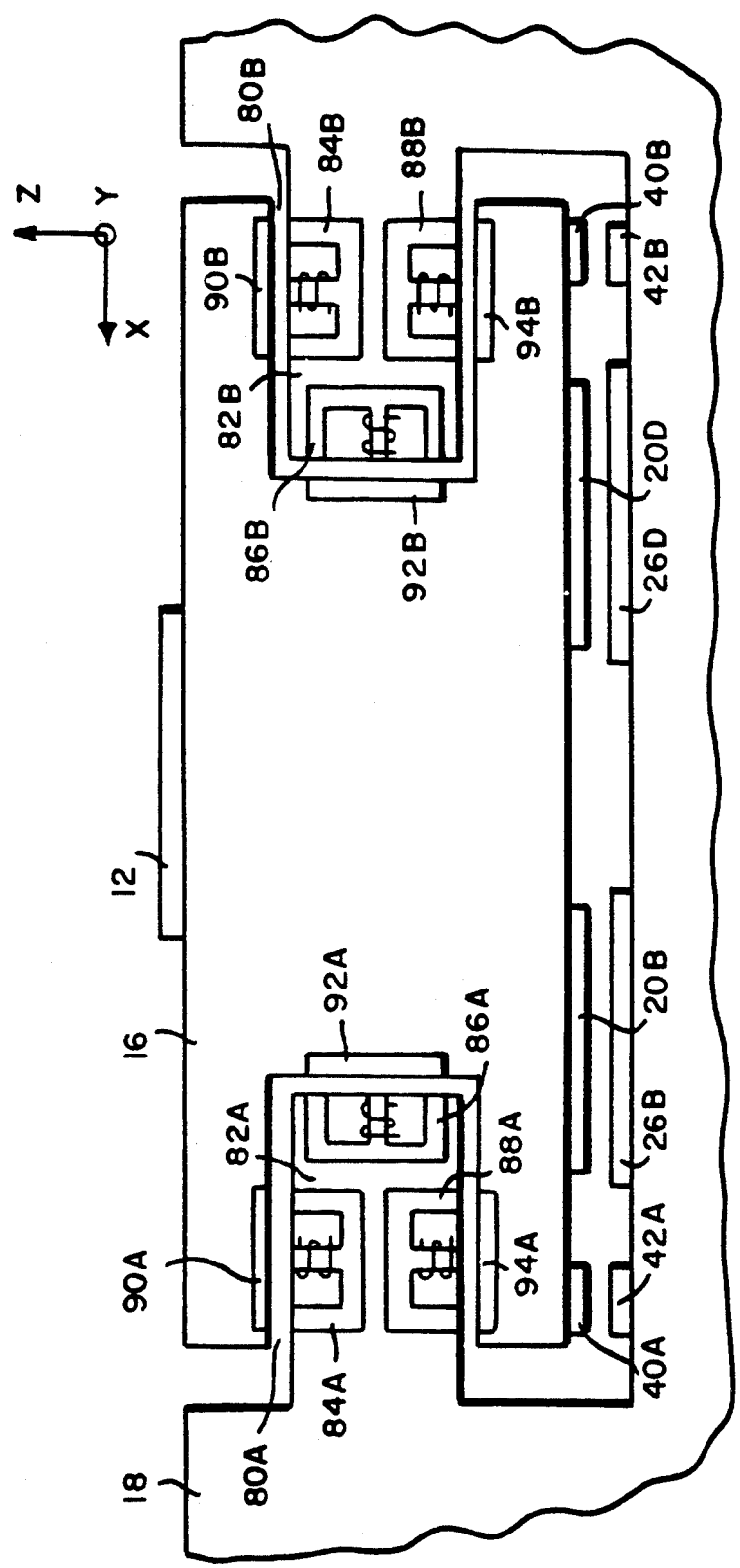
FIG. 9 is a front view of a second alternative embodiment of the invention.

FIG. 9 shows another embodiment of the invention which, again, has coil arrays 26 and magnetic arrays 20 for causing linear motion in the X direction in the manner previously described. It should be noted that for the embodiments of FIGS. 8 and 9, the coil arrays and magnetic arrays may be substantially the same width while still maintaining full coupling since there is very little movement of the platen in the X and Z directions. Again, permanent magnets 40 and 42 are provided to support the weight of the platen. In FIG. 9, two pairs of magnets (40A/42A and 40B/42B) are shown for performing this function rather than a single pair of such magnets as for prior embodiments. While a single pair of repulsive magnets is adequate for providing weight support only, two or more magnet pairs suitably spaced around the bottom of the platen can provide enhanced stability against angular movement (i.e. rotation about the X or Y axes) and thus may reduce the need for supplying currents to correct for perturbations in these dimensions.

The embodiment of FIG. 9 differs from the embodiment of FIG. 8 primarily in that arrays 20 and 26 are utilized primarily to control linear position in the Y dimension. Corrections for perturbations in other dimensions are for the most part provided by six or twelve windings wrapped on E-cores mounted on projections from stator 18 interacting with ferrous inserts mounted opposite such coils in platen 16. In particular, the platen has a channel 80A formed in one side and a channel 80B formed in its other side. The stator 18 has at least one projection 82A which fits in but does not contact channel 80A and a projection 82B which fits in but does not contact channel 80B. For reasons discussed later, projections 82 either extend for some distance along the platen in the corresponding channel 80 or there are a pair of such projections spaced in the Y direction. Each projection 82 has three electromagnets 84, 86 and 88 mounted therein, each electromagnet consisting of an E-core having a wire coil wrapped around the center leg of the core. If split arrays 26 such as are shown in FIG. 8B are not employed, then two sets of E cores spaced in the Y direction are required on each projection 82 (or one set on each projection where there are two spaced projections in each channel 80). E-cores 84 face upward in the Z direction, E-cores 86 face toward the platen in the X direction and E cores 88 face downward in the Z direction. A strip of ferrous material is positioned in platen 16 opposite each electromagnet, iron target strips 90 being opposite electromagnets 84, iron target strips 92 being opposite electromagnets 86 and iron target strips 94 being opposite electromagnets 88. Each iron target strip extends in the Y direction for a sufficient length so that the corresponding electromagnet is always fully coupled to the iron strip regardless of the linear Y position of the platen. Iron strips 90, 92, 94 should be made of stacked laminations lying in the X-Y plane.

In operation, linear movement of the platen in the Y direction is accomplished in the manner previously described by applying currents of suitable amplitude, polarity and phase to coil arrays 26B and 26D. Perturbations in the X direction are corrected by applying current to electromagnet(s) 86 in one of the channels 80. Perturbations in the Z direction are corrected by applying currents either to the electromagnets 84 or the electromagnets 88, depending on the direction of the Z direction perturbation. Rotations about the Y axis are corrected by energizing an appropriate pair of the electromagnets 84,88. For example, a clockwise rotation of the platen about the Y axis may be corrected by applying a counterclockwise force to the platen by the energization of electromagnets 84A and/or 88B. Correction for rotations about the X axis are made as discussed for FIG. 8B with split coils 26, or preferably by energizing appropriate ones of spaced coils 84,88 (for embodiments with two spaced coils 84,88 in each channel 80) to apply a corrective torque about the X-axis to platen 16. Rotations about the Z axis may be corrected in the manner previously described by energizing coil arrays 26 to drive magnetic arrays 20 in opposite directions. Alternatively, where multiple coils/metal strips 86,92 are used in each channel 80, selected pairs of the coils 86 may be energized to control Z rotation.

In the discussion above, the adjacent surfaces of the magnet arrays and coil arrays have been shown as being flat and planar. This is not, however, a limitation on the invention. All that is required is that the adjacent magnet array/coil array surfaces be smooth and spaced by a uniform gap. The surfaces themselves may be flat or curved to achieve a desired direction of motion or rotation. Similarly, while in the discussion above it has been assumed that there is a step motion of platen 16 to a desired position where work is to be performed, the device can also be operated in a scanning mode where work, for example the forming of an interconnect lead, is performed as the platen is moved from one position to another. When operating in the scanning mode, coil array current amplitude, polarity and phase are carefully controlled to maintain a substantially constant or other known rate of travel through the work path. The invention may also be utilized in applications other than the semiconductor fabrication application disclosed.

While the invention has been particularly shown and described above with reference to preferred embodiments and large numbers of alternatives have been mentioned in conjunction with the various embodiments described, it will be apparent to those skilled in the art that the discussion above is for purposes of illustration and that many additional variations may be made in form and details of construction while still remaining within the scope of the invention. It is, therefore, the intent that the invention be limited only by the scope of the following claims.

What is claimed is:

1. A device for positioning a movable member having a first surface relative to a stationary member having a second surface, said first and second surfaces being adjacent each other, the device comprising:
   a magnetic array mounted in one of said surfaces, said array having adjacent magnetic elements in the direction of movement which are adapted to be of opposite polarity;
   a multiphase coil array mounted in the other of said surfaces, said other surface being formed of a material having low magnetic permeability;
   said magnetic array and coil array being mounted so as to provide smooth, mating adjacent surfaces spaced from each other by a substantially uniform gap; and
   means for selectively applying controlled currents to each phase of said coil array in a phase, amplitude and polarity to interact with said magnetic array to drive said movable member to a selected position relative to aid stationary member.

2. A device as claimed in claim 1 wherein said magnetic array is an array of permanent magnets, with adjacent magnets being oppositely poled.

3. A device as claimed in claim 2 wherein said array of permanent magnets are flush mounted in said first surface.

4. A device as claimed in claim 1 wherein each of said arrays has a pitch, and wherein said pitches are integral multiples of each other.

5. A device as claimed in claim 4 wherein said pitches are substantially equal.

6. A device as claimed in claim 1 wherein forces generated when currents are applied to said coil array have a component parallel to the arrays and a component perpendicular to the arrays, wherein the parallel component is operable to move the movable member to the selected position, and including means for utilizing the perpendicular component to support the movable member, and to thereby maintain said gap.

7. A device as claimed in claim 6 wherein said moving member has a weight which may vary, and including means for varying the perpendicular force applied to the moving member to maintain a desired gap between said first and second surfaces.

8. A device as claimed in claim 7 including a ferrous backing sheet for said coils, said means for varying including means for varying the spacing between the backing sheet and the coil array.

9. A device as claimed in claim 1 including means for maintaining a desired gap between said first and second surfaces.

10. A device as claimed in claim 9 wherein said gap maintaining means includes first and second magnetic elements mounted respectively to said moving member and said stationary member, said elements being adjacent mounted and being poled to counteract the effects of gravity on the moving member.

11. A device as claimed in claim 10 wherein the first magnetic element is mounted to the bottom surface of the moving member and the second magnetic element is mounted to the adjacent surface of the stationary member; and
wherein said magnetic elements are poled to repel.

12. A device as claimed in claim 10 wherein the moving member has a weight which may vary, and wherein at least one of said magnetic elements is movable in a direction perpendicular to said gap to permit a desired gap to be maintained regardless of variations in moving member weight.

13. A device as claimed in claim 10 wherein one of said magnetic elements is sufficiently larger than the other so that said magnetic elements are fully coupled regardless of any allowed movement of said platen.

14. A device as claimed in claim 1 wherein said coil array is at least a three phase array.

15. A device as claimed in claim 1 wherein the relative movement between said members is in at least a first degree of freedom parallel to said surfaces; and
including means for controlling the relative position of said members in other selected degrees of freedom.

16. A device as claimed in claim 15 wherein said means for controlling includes means for indicating a desired relative position for each of said degrees of freedom, means for detecting deviations from desired position for the degrees of freedom, and means responsive to a detected deviation for applying an electromagnetic force to the moving member in a direction to move the moving member to the desired relative position.

17. A device as claimed in claim 16 wherein said means for applying an electromagnetic force includes electromagnet elements mounted to the stationary member, a ferrous element mounted to the moving member adjacent each electromagnet element, each said electromagnet element/ferrous element pair being positioned to move the moving member in at least one degree of freedom when the electromagnet element is energized, and means responsive to a detected deviation for selectively energizing the electromagnet elements.

18. A device as claimed in claim 15 wherein there are at least two magnetic array/coil array pairs for controlling motion in said first degree of freedom.

19. A device as claimed in claim 18 wherein for each magnetic array/coil array pair on one side of the moving member, there is a corresponding magnetic array/coil array pair on the opposite side of the moving member.

20. A device as claimed in claim 18 wherein the first surface is the bottom surface of the moving member, and wherein there are two symmetrically positioned magnetic arrays in said first surface, there being an adjacent corresponding coil array for each of said magnetic arrays.

21. A device as claimed in claim 20 wherein there is a magnetic array in the top surface of the moving member substantially opposite each magnetic array in the bottom surface, there being an adjacent corresponding coil array for each of said magnetic arrays.

22. A device as claimed in claim 18 wherein there is at least one magnetic array in the bottom surface of said moving member and a magnetic array in each of the two side surfaces of the member parallel to said first degree of freedom, there being an adjacent corresponding coil array for each of said magnetic arrays.

23. A device as claimed in claim 15 wherein said means for controlling includes at least one magnetic array/coil array pair for controlling relative movement between said members in a second degree of freedom.

24. A device as claimed in claim 23 wherein there are two symmetrically positioned magnetic arrays oriented parallel to the first degree of freedom and two symmetrically positioned magnetic arrays oriented parallel to the second degree of freedom in at least one of the top and bottom surfaces of the moving member, there being an adjacent corresponding coil array for each magnetic array.

25. A device as claimed in claim 23 wherein one array of each magnetic array/coil array pair for controlling motion in the first degree of freedom is sufficiently wider in the direction of the second degree of freedom than the other array so that the arrays fully overlap regardless of any allowed movement in the second degree of freedom, and wherein one array of each magnetic array/coil array pair for controlling motion in the second degree of freedom is sufficiently wider in the direction of the first degree of freedom than the other array so that the arrays fully overlap regardless of any movement in the first degree of freedom.

26. A device as claimed in claim 23 wherein said magnetic arrays are in the bottom surface of the moving member.

27. A device as claimed in claim 1 including means for detecting the relative position of the members in at least a first degree of freedom, means for indicating a selected relative positions in said first degree of freedom, and wherein said means for selectively applying includes means responsive to the detected relative position and the selected relative positions for producing control currents to move the movable member in said first degree of freedom toward the selected relative position.

28. A device as claimed in claim 27 wherein said means for producing control current includes a linear feedback compensator 29. A device as claimed in claim 27 wherein said means for producing control current includes a nonlinear geometric compensator to compensate for changes in relative positions of the center of mass of the moving member as it is moved relative to the stationary member.

30. A device as claimed in claim 27 wherein said means for producing control current includes a commutation circuit to compensate for nonlinearities in the control currents as a function of relative position.

31. A device as claimed in claim 27 wherein said means for detecting and said means for indicating are for two degrees of freedom, wherein there is at least one magnetic array/coil array pair for controlling relative movement in each of said two degrees of freedom, and wherein said means for producing control currents produces control currents to the coil arrays to move the movable member in said two degrees of freedom to the selected relative position.

32. A device as claimed in claim 31 wherein there are two symmetrically positioned magnetic array/coil array pairs for each degree of freedom, each magnetic array being oriented in the direction of the degree of freedom it controls and being in at least one of the bottom and top surfaces of the moving member, and wherein the means for producing control currents produces appropriate control currents for each coil array to move the movable member to the selected relative position.

33. A device as claimed in claim 27 wherein said means for detecting includes interferometric detectors for detecting relative movement and capacitive detectors for detecting relative positions.

34. A device as claimed in claim 1 wherein at least said movable member is formed of a cellular composite material.

35. A device as claimed in claim 1 including a damping fluid in said gap.

36. A device as claimed in claim 35 wherein said gap damping fluid is a ferrofluid.

37. A device as claimed in claim 1 wherein said device is a fine positioning stage of a positioning system, the stationary member being mounted to a movable frame of a system coarse positioning stage.

38. A device as claimed in claim 1 wherein the adjacent mating surfaces of said magnetic array and said coil array are planar surfaces.

39. A device as claimed in claim 1 wherein at least selected ones of said coil arrays are formed of a plurality of independently energized coil arrays spaced in the direction of movement by a distance less than the extent in the direction of movement of the corresponding magnetic arrays.

40. A device for positioning in at least two degrees of freedom a movable member having a top and bottom surface relative to a stationary member having corresponding surfaces adjacent to at least one of said top and bottom surfaces, the device comprising:

at least one magnetic array mounted in one of said member surfaces for each of said degrees of freedom, each of said arrays having adjacent magnetic elements in the direction of the degree of freedom which elements are of opposite polarity;

a multiphase coil array for each magnetic array mounted in the surface adjacent said one surface of the other member;

each magnetic array/coil array pair being mounted so as to provide smooth, mating adjacent surfaces spaced from each other by a substantially uniform gap; and means for applying controlled currents for each phase of each of said coil arrays in a phase, amplitude and polarity to interact with the corresponding magnetic array to drive the movable member in said at least two degrees of freedom to a selected position relative to said stationary member.

41. A device as claimed in claim 40 wherein there are two symmetrically oriented magnetic arrays in at least one of said top and bottom surfaces for each of a first and a second degree of freedom, there being corresponding adjacent coil arrays in adjacent surfaces of said stationary member; and wherein said means for applying includes, means for detecting the relative positions of said members in six degrees of freedom, means for indicating desired relative positions for the members in said six degrees of freedom, and means responsive to a detected relative position in a degree of freedom being different than the desired relative position in such degree of freedom for applying currents to at least selected ones of said coil arrays to move the movable member to the desired position.

42. A device as claimed in claim 41 said first and second degrees of freedom are both substantially parallel to the surfaces spaced by said gap and are substantially perpendicular to each other.

* * * * *